(12) United States Patent
Joret

(10) Patent No.: US 6,503,557 B1
(45) Date of Patent: Jan. 7, 2003

(54) PROCESS FOR DEPOSITING AT LEAST ONE THIN LAYER BASED ON SILICON NITRIDE OR OXYNITRIDE ON A TRANSPARENT SUBSTRATE

(75) Inventor: Laurent Joret, Paris (FR)

(73) Assignee: Saint-Gobain Vitrage, Courbevoie (FR)

( * ) Notice: Subject to any disclaimer, the term of this patent is extended or adjusted under 35 U.S.C. 154(b) by 0 days.

(21) Appl. No.: 09/564,751

(22) Filed: May 4, 2000

Related U.S. Application Data (62) Division of application No. 09/021,307, filed on Feb. 10, 1998, now Pat. No. 6,114,043.

(30) Foreign Application Priority Data

Feb. 10, 1997 (FR) .............................................. 97 01468

(51) Int. Cl.⁷ ................................................ C23C 16/34
(52) U.S. Cl. ................................. 427/167; 427/255.394
(58) Field of Search ................................. 427/165, 166, 427/167, 255.29, 255.393, 255.394

(56) References Cited

U.S. PATENT DOCUMENTS

| | | | |
|---|---|---|---|
| 4,091,169 A | | 5/1978 | Bohg et al. |
| 4,992,299 A | * | 2/1991 | Hochberg et al. ............. 427/579 |
| 5,116,665 A | | 5/1992 | Gauthier et al. |
| 5,118,573 A | * | 6/1992 | Tawara et al. ............... 427/166 |
| 5,279,722 A | | 1/1994 | Szczyrbowski et al. |
| 5,342,675 A | | 8/1994 | Kobayashi et al. |
| 5,411,794 A | | 5/1995 | Kawaguchi et al. |
| 5,543,229 A | | 8/1996 | Ohsaki et al. |
| 5,639,671 A | * | 6/1997 | Bogart et al. ................. 427/166 |
| 5,665,424 A | * | 9/1997 | Sherman ................ 427/249.15 |
| 5,750,267 A | | 5/1998 | Takase et al. |
| 5,861,189 A | * | 1/1999 | Sheel et al. .................. 427/166 |
| 5,939,201 A | * | 8/1999 | Boire et al. .................. 427/166 |
| 6,235,343 B1 | * | 5/2001 | Joret et al. ................... 427/166 |

FOREIGN PATENT DOCUMENTS

| | | |
|---|---|---|
| EP | 0 425 825 | 5/1991 |
| EP | 0 518 755 | 12/1992 |
| EP | 0 638 527 | 2/1995 |
| EP | 0 650 938 | 5/1995 |
| FR | 2 736 632 | 1/1997 |
| WO | WO 89/10903 | 11/1989 |

OTHER PUBLICATIONS

Kanji Yasui, et al., "Growth of Low Stress SIN Films Containing Carbon by Magnetron Plasma Enhanced Chemical Vapor Deposition", *Journal of Non–Crystalline Solids*, vol. 127, No. 1, pp. 1–7, Jan. 1991.

(List continued on next page.)

*Primary Examiner*—Bret Chen
(74) *Attorney, Agent, or Firm*—Oblon, Spivak, McClelland, Maier & Neustadt, P.C.

(57) ABSTRACT

The invention relates to a coated glass substrate, covered with at least one thin layer based on silicon nitride or silicon oxynitride. The thin layer contains the elements Si, O, N, C in the following atomic percentages:

| | |
|---|---|
| Si: | from 30 to 60%, |
| N: | from 10 to 56%, |
| O: | from 1 to 40%, |
| C: | from 1 to 40%. |

The invention also relates to the process for obtaining the coated glass substrate using a gas-phase pyrolysis technique, and to its applications.

5 Claims, 2 Drawing Sheets

OTHER PUBLICATIONS

Kanji Yasui, et al., "Chemical Vapor Deposition of Low Hydrogen Content Silicon Nitride Films Using Microwave–Excited Hydrogen Radicals", *Japanese Journal of Applied Physics*, vol. 29, No. 5, Part 1, pp. 918–922, May 1, 1990.
Patent Abstracts of Japan, vol. 16, No. 400 (C–0977), Aug. 25, 1992, JP 4–132639, May 6, 1992. No Page Number.
Patent Abstracts of Japan, vol. 13, No. 524 (P–964), Nov. 22, 1989, JP 1–213600, Aug. 28, 1989. No Page Number.
Patent Abstracts of Japan, vol. 17, No. 674 (C–1140), Dec. 10, 1993, JP 5–221689, Aug. 31, 1993. No Page Number.
Patent Abstracts of Japan, vol. 16, No. 548 (C–1005), Nov. 18, 1992, JP 4–209733, Jul. 31, 1992. No Page Number.

* cited by examiner

PROCESS FOR DEPOSITING AT LEAST ONE THIN LAYER BASED ON SILICON NITRIDE OR OXYNITRIDE ON A TRANSPARENT SUBSTRATE

This application is a Divisional of application Ser. No. 09/021,307 filed Feb. 10, 1998, now U.S. Pat. No. 6,114,043.

BACKGROUND OF THE INVENTION

1. Field of the Invention

The present invention relates to a transparent substrate which is provided with at least one thin layer that is based on silicon nitride or silicon oxynitride. One application of the invention is the manufacture of so-called functional glazing assemblies used in buildings, vehicles, or as a plasma television screen. Another application which may be envisaged is the surface treatment of glass bottle containers. The invention also relates to a process for depositing these layers using a pyrolysis reaction.

2. Discussion of the Background

Within the context of the invention, the term functional glazing assembly should be understood to mean a glazing assembly in which at least one of its constituent transparent substrates is covered with a stack of thin layers so as to give it particular properties, especially thermal, optical, electrical or mechanical properties, such as scratch-resistance.

As an example, so-called low-emissivity thin layers are typically composed of a doped metal oxide, for example fluorine-doped tin oxide ($F:SnO_2$) or tin-doped indium oxide (ITO), which may be deposited on glass using pyrolysis techniques. Once coated with a low-emissivity layer, the substrate mounted in a glazing assembly, in particular in a building, makes it possible to reduce emission, in the far infrared, to the outside of the room or vehicle interior through the said glazing assembly. By reducing the energy losses due in part to this radiation leakage, the thermal comfort is greatly improved, and particularly in the winter.

Alternatively, the substrate thus covered may be mounted in a double-glazing assembly; the low-emissivity layer being turned towards the gas-filled cavity separating the two substrates, for example, as the 3 face (the faces of a multiple-glazing assembly are conventionally numbered starting from the outermost face with respect to the room or the vehicle interior). The double-glazing assembly thus formed has enhanced thermal insulation, with a low heat-exchange coefficient, K, while maintaining the benefit of solar energy influx, with a high solar factor (i.e. the ratio of the total energy entering the room to the incident solar energy). On this subject, the reader may refer, in particular, to patent applications, EP-0,544,577, FR-2,704,543 and EP-0,500,445.

The low-emissivity layers are generally made of good electrical conductors. This allows the glazing assemblies, by providing suitable current leads, to be used as heating/de-icing glazing assemblies in motor vehicles, which application is described, for example, in EP-0,353,140.

Thin filtering layers, also called selective or anti-solar layers, are known which, when deposited on substrates mounted in a glazing assembly, make it possible to reduce the heat influx from solar radiation through the glazing assembly into the room or vehicle interior, by absorption/reflection. The layers may, for example, be layers of titanium nitride TiN (or titanium oxynitride), such as those obtained using a gas-phase pyrolysis technique and described in patent applications EP-0,638,527 and EP-0,650,938. The layer may also be a thin (less than or equal to 30 nm) reflective layer of aluminum, obtained by condensation of a metal vapor, CVD or the technique described in international patent application PCT/FR-96/00362 filed on Mar. 7, 1996, in the name of Saint-Gobain Vitrage.

The invention also relates to the techniques for depositing these various layers, and more particularly to those involving a pyrolysis reaction. These techniques consist in spraying "precursors", for example of an organometallic nature, which are either in the form of a gas, or in the form of a powder, or are liquids by themselves or else in solution in a liquid, onto the surface of the substrate which is heated to a high temperature. On coming into contact with the substrate, the said precursors decompose thereon, leaving, for example, a layer of metal, oxide, oxynitride or nitride. The advantage of pyrolysis resides in the fact that it allows direct deposition of the layer onto the glass ribbon in a line for manufacturing flat glass of the float type, continuously, and also in the fact that the pyrolysed layers have (in general) very good adhesion to the substrate.

The low-emissivity or filtering layers mentioned above frequently form part of a stack of layers and are, at least on one of their faces, in contact with another layer, generally a dielectric material having an optical and/or protective role.

Thus, in the aforementioned patent applications EP-0,544,577 and FR-2,704,543, the low-emissivity layer, for example made of $F:SnO_2$, is surrounded by two layers of dielectric of the $SiO_2$, SiOC or metal-oxide type, which layers have a refractive index and a thickness which are selected so as to adjust the optical appearance of the substrate, in particular in reflection, for example its color.

In patent application EP-0,500,445, also previously mentioned, the low-emissivity layer of ITO lies under a layer of aluminum oxide so as to protect it from oxidation and also, under certain conditions, to avoid having to subject it to a reducing annealing operation and/or to allow the coated substrate to be bent or toughened without adversely affecting its properties.

The $TiO_2$ layer or the $TiO_2$/SiOC double layer which covers the TiN filtering layer in the aforementioned patent application EP-0,650,938 also protects the TiN from oxidation and improves its durability in general.

However, the integrity of the stacks of thin layers is important. Thus, it is necessary for them to display:

the ability to withstand chemical attack. It frequently happens that the transparent substrate, once coated with layers, is stored for quite a long period before being mounted in a glazing assembly. If the coated substrate is not carefully packaged in a sealed, and therefore expensive manner, the layers with which it is coated may be directly exposed to a contaminated atmosphere or may be subjected to cleaning by detergents which are not well suited to removing dust therefrom, even if the substrates are subsequently joined together in a double-glazing assembly or in a laminated glazing assembly with the deposited thin layers as the 2 or 3 face, and therefore protected. Moreover, apart from the storage problem, there is a disincentive to use the substrates as "monolithic glazing assemblies" or to arrange the layers as the 1 or 4 face in the case of multiple glazing assemblies, i.e., configurations in which the layers are exposed all year long to the ambient atmosphere if the stacks are susceptible to chemical corrosion;

the ability to resist mechanical damage. For example, the transparent substrate, once coated with layers, may be used in configurations in which it is readily exposed to scratching damage. Consequently, on the one hand, the substrate no longer has a "correct" aesthetic appearance, since it is partially scratched, and, on the other hand, the durability of both the stack and the substrate is greatly diminished, because scratching may introduce possible sites of mechanical weakness, depending on the case.

There is therefore a continual search for a stack of layers having improved chemical and/or mechanical durability. However, these improvements must not adversely affect the optical properties of the assembly formed by the substrate and the stack of thin layers.

As mentioned previously, overlayers of dielectric material already exist which protect the underlying layers in the stack. In order to maintain integrity of an assembly that is exposed to intense or lengthy chemical corrosion, and/or to protect the possibly "weaker" underlying layers completely, patent application EP-0,712,815 describes a thin layer based on an oxide comprising silicon and a third element, for example a halogen of the fluorine F type, which facilitates the formation of a mixed silicon/aluminum structure.

The layer described above is particularly suitable for use as the final layer in stacks in which the functional layer is of the filtering or low-emissivity type on glazing assemblies, since it may fulfil an optical function such as optimizing the appearance in reflection, and may guarantee a degree of constancy of the appearance of the glazing assemblies over time.

However, the above-described layer is not necessarily capable of resisting mechanical damage, such as scratches, since does not have an extremely high hardness.

It is known that one type of hard thin layer most particularly designed to be durable and stable with respect to mechanical abrasion and/or chemical attack is a thin layer based on silicon nitride which may, as the case may be, contain a certain amount of oxygen and carbon.

Thus, one type of thin layer based on silicon nitride is known, this being deposited on a substrate by a gas-phase pyrolysis technique using two precursors, the silicon-containing precursor being a silane and the nitrogen-containing precursor being either inorganic, of the ammonia type, or organic, of the hydrazine type, in particular methyl-substituted hydrazine.

However, when the deposition is carried out using nitrogen-containing precursors of the ammonia type, the temperatures are too high (greater than 700° C.) to be compatible with continuous deposition on a ribbon of silica-soda-lime glass in the chamber of a float bath since, at these temperatures, these standard glasses have not yet reached their dimensional stability.

In addition, the nitrogen-containing precursors of the hydrazine type have a degree of toxicity which makes their industrial application problematic.

It is also known to deposit a thin layer based on silicon nitride by the above-mentioned technique by using not two precursors but only one; one that contains both silicon and nitrogen, e.g., $Si(NMe_2)_{4-n}H_n$. However, the deposition rates that may be achieved are too low to exploit the deposition process on an industrial scale. Furthermore, the synthesis of the precursor is relatively complex and therefore expensive, and the respective proportions of the nitrogen-containing and silicon-containing precursor cannot be varied.

In addition, the known thin layers based on silicon nitride have certain drawbacks:

on the one hand, they are not necessarily sufficiently hard and are less durable, in particular when they are vacuum-deposited in order to, for example, endow a substrate provided with this single layer, or with a stack of thin layers comprising this layer, with a scratch-resistance function; and on the other hand, when they are deposited by pyrolysis, they are absorbent at wavelengths in the visible range, which is deleterious from an optical standpoint.

SUMMARY OF THE INVENTION

Accordingly, one object of the invention is thus to remedy the aforementioned drawbacks and to develop a novel thin layer based on silicon nitride or silicon oxynitride having a greater hardness while being very much less absorbent, and capable of forming part of a stack of thin layers, in particular so as to protect the stack of thin layers with respect to chemical attack.

Another object of the invention is to provide a novel process for depositing a thin layer based on silicon nitride or silicon oxynitride using a gas-phase pyrolysis technique which is compatible with continuous deposition on a ribbon of glass in the chamber of a float bath and which allows high deposition rates to be achieved.

These and other objects have been achieved by the present invention, which provides a coated glass substrate covered with at least one thin layer based on silicon nitride or silicon oxynitride.

Thus, the first embodiment of the present invention provides coated glass substrate that includes a glass substrate and at least one thin layer based on silicon nitride or silicon oxynitride, wherein thin layer includes the elements Si, O, N, and C in the following atomic percentages:

| | |
|---|---|
| Si: | from 30 to 60%; |
| N: | from 10 to 56%; |
| O: | from 1 to 40%; and |
| C: | from 1 to 40%. |

The second embodiment of the present invention provides process for depositing a thin layer on a glass substrate that includes gas-phase pyrolyzing at least two precursors onto a glass substrate, wherein at least two precursors include at least one silicon precursor and at least one nitrogen precursor, wherein the nitrogen precursor is an amine.

The third embodiment of the present invention provides an article or glazing assembly that includes a glass substrate coated with a thin layer based on silicon nitride or silicon oxynitride, wherein the thin layer includes the elements Si, O, N, and C in the following atomic percentages:

| | |
|---|---|
| Si: | from 30 to 60%; |
| N: | from 10 to 56%; |
| O: | from 1 to 40%; and |
| C: | from 1 to 40%. |

Surprisingly, this thin layer has turned out to be both very hard, compared to the other known thin layers based on silicon nitride, and very transparent and therefore has a low or zero absorbance at the wavelengths in the visible range: the high Si and N contents show that what is involved is a material which is mostly silicon nitride. By varying the proportions between the minor constituents, C and O, the properties of the layer may be finely adjusted. Thus, by varying the relative proportions of carbon and oxygen, it is possible both, for example, to "fine tune" the density and the refractive index of the thin layer so as to endow it with a mechanical hardness and with optical properties which are very useful and desirable. In order to vary the aforementioned relative proportions, this may possibly be accomplished using a gentle oxidizing agent of the $CO_2$ type, for example for optical reasons. This is because carbon and nitrogen have a tendency to increase the refractive index, oxygen having more the opposite effect.

BRIEF DESCRIPTION OF THE PREFERRED EMBODIMENTS

Various other objects, features and attendant advantages of the present invention will be more fully appreciated as the same becomes better understood from the following detailed description, which is not intended to be limiting unless otherwise specified.

Preferably, the thin layer contains Si, O, N and C in the following atomic percentages: 40–50% Si, 20–56% N, 5–30% O, and 5–30% C.

Preferably, the refractive index of the thin layer is greater than 1.6, in particular between 1.8 and 2.0, more preferably 1.85.

The thin layer may contain other elements in the form of an additive, such as fluorine, phosphorus or boron, preferably in an atomic percentage of between 0.1 and 5%. The layer may also be homogeneous or have a composition gradient through its thickness.

Preferably, the thin layer has a light absorption coefficient $A_L$ of less than 2% for a geometrical thickness of 100 nanometers, which optical quality is particularly demonstrated when the said layer is deposited using a gas-phase pyrolysis technique, as explained below.

The thin layer preferably forms part of a stack of thin layers, at least one layer of which is a functional layer having thermal, in particular filtering, solar-protection or low-emissivity properties and/or electrical properties and/or optical properties and/or photocatalytic properties, such as a layer having a mirror function, of the type containing a doped metal oxide, of a metal nitride/oxynitride or of a metal of the aluminum or silicon type. It may also form part of a stack of antireflection layers, acting as the high-index or "intermediate"-index layer.

It is preferable to choose, as the doped metal oxide or the metal nitride/oxynitride, fluorine-doped tin oxide $F:SnO_2$, tin-doped indium oxide ITO, indium doped zinc oxide In:ZnO, fluorine-doped zinc oxide F:ZnO, aluminum-doped zinc oxide Al:ZnO, tin-doped zinc oxide Sn:ZnO, the mixed oxide $Cd_2SnO_4$, titanium nitride TiN or zirconium nitride ZrN.

Preferably, the thin layer may be located under the functional layer. It may then fulfil, in particular, the role of a barrier layer to the diffusion of ions, especially of alkali metals, and of oxygen from the glass-type substrate, or else the role of a nucleation layer, and/or have an optical role (adjustment of the color, anti-iridescence effect, antireflection effect). In some applications of the plasma-screen type, it may also fulfil the role of a barrier layer to the migration of $Ag^+$ ions from the silver-based functional layers into the glass-type substrate.

Preferably, the thin layer may be located on the functional layer. It may then serve, in particular, as a layer for protecting the functional layer from high-temperature oxidation or from chemical corrosion, as a mechanical protection layer of the scratch-resistant type, a layer having an optical role or a layer improving the adhesion of the upper layer.

Preferably, the thin layer is the only layer covering the substrate and advantageously fulfills a scratch-resistance function. The geometrical thickness of the layer may be very freely adjusted within a very wide preferred range of 5 nm to 5 µm, in particular between 20 and 1000 nanometers, quite a substantial thickness of at least 250 nm being, for example, preferred in order to accentuate the scratch-resistance effect of the substrate provided with the thin layer, a layer having a smaller thickness being generally desired for another functionality (nucleation, adhesion, etc.).

The subject of the invention is also the process for obtaining the above-defined substrate, which process includes depositing the thin layer based on silicon nitride by means of a gas-phase pyrolysis technique (also called CVD) or using at least two precursors, including at least one silicon precursor and at least one nitrogen precursor. According to the process of the invention, at least one nitrogen precursor is an amine.

The choice of such a nitrogen-containing precursor is particularly advantageous: it has sufficient reactivity insofar as it makes it possible to carry out the deposition at temperatures at which the glass substrate of the standard silica-soda-lime type has fully achieved its dimensional stability, in particular in the context of a float-glass production line.

In addition, the deposition rates achieved are sufficiently high to be able to deposit substantial thicknesses in the float chamber.

The silicon-containing precursor chosen is not particularly limiting but is preferably a silane, such as silicon hydride and/or alkyl silane, or a silazane. The silane or silazane may be preferably substituted with hydrogen or an alkyl group or a mixture thereof. The alkyl group may preferably be a $C_{1-24}$ branched or unbranched or unsaturated alkyl group. More preferably the alkyl group is a $C_{1-6}$alkyl group.

The amine may be chosen from primary, secondary or tertiary amines, and preferably those with alkyl radicals having from 1 to 6 carbon atoms each.

Thus, the amine may be ethylamine, $C_2H_5NH_2$, methylamine, $CH_3NH_2$, dimethylamine, $(CH_3)_2NH$, butylamine, $C_4H_9NH_2$ or propylamine, $C_3H_7NH_2$.

The choice of suitable amine for a layer having a given geometrical thickness and/or a given refractive index is easily determined and results from a compromise between a certain number of parameters such as steric hindrance, reactivity, etc.

Preferably, the ratio, in terms of number of moles, of the amount of nitrogen precursor to the amount of silicon-containing precursor is between 5 and 30, and more preferably is equal to 10.

It is preferable to control such a ratio in order to avoid, on the one hand, insufficient incorporation of nitrogen and, on the other hand, any risk of nucleation in the gas phase and consequently any risk of forming powder. The risks of clogging up the device and reductions in production efficiency are thus limited.

Preferably, when it is desired to incorporate an additive, a precursor of the additive independent of the silicon-containing precursor and the amine precursor is chosen. It may, for example, be a fluorinated gas of the $CF_4$ type when the desired additive is fluorine F or an organic phosphate carrier gas of the $PO(OCH_3)_3$ type or a gas of the triethylphosphite, trimethylphosphite, trimethylborite, $PF_5$, $PCl_3$, $PBr_3$ or $PCl_5$ type when the desired additive is phosphorus P or boron B. Advantageously, these additives generally allow the deposition rate to be increased.

The deposition temperature is appropriate to the choice of precursors, in particular the amine. Preferably, it is between 550 and 760° C., It may preferably be between 600 and 700° C., i.e. between the temperature at which the glass, in particular silica-soda-lime glass, is dimensionally stable and the temperature that the glass has on exiting the float chamber.

Advantageously, the variant in which the glass composition of the substrate is suitable for an electronic application is between 660° and 760° C., According to this variant, an advantageous composition may be that described in Application WO 96/11887, the entire contents of which are hereby incorporated by reference. This composition, expressed in percentages by weight, is of the type:

| $SiO_2$ | 45–68% |
|---|---|
| $Al_2O_3$ | 0–20% |
| $ZrO_2$ | 0–20% |
| $B_2O_3$ | 0–20% |
| $Na_2O$ | 2–12% |
| $K_2O$ | 3.5–9% |
| CaO | 1–13% |
| MgO | 0–8% | with:
$SiO_2+Al_2O_3+ZrO_2 \leq 70\%$
$Al_2O_3+ZrO_2 \geq 2\%$
$Na_2O+K_2O \geq 8\%$
and optionally BaO and/or SrO in the following proportions:

$11\% \leq MgO+CaO+BaO+SrO \leq 30\%$ with a lower annealing temperature of at least 530° C. and an $\alpha$ coefficient of 80 to $95 \times 10^{-7}/°C$.

Another advantageous composition, drawn from Application FR 97/00498, the entire contents of which are incorporated by reference, is, still in percentages by weight, of the type:

| $SiO_2$ | 55–65%, preferably 55–60% |
|---|---|
| $Al_2O_3$ | 0–5% |
| $ZrO_2$ | 5–10% |
| $B_2O_3$ | 0–3% |
| $Na_2O$ | 2–6% |
| $K_2O$ | 5–9% |
| MgO | 0–6%, preferably 1–6% |
| CaO | 3–11%, preferably 7–11% |
| SrO | 4–12% |
| BaO | 0–2% | with:
$Na_2O+K_2O \geq 10\%$
$MgO+CaO+SrO+BaO > 11\%$, preferably >15%
and a lower annealing temperature of at least 600° C., (Another preferred embodiment consists in choosing an $Al_2O_3$ content of 5 to 10% and a $ZrO_2$ content of 0 to 5%, keeping the proportions of the other constituents unchanged).

It will be recalled that the so-called lower annealing ("strain-point") temperature is the temperature that a glass has when it reaches a viscosity $\eta$ equal to $10^{14.5}$ poise.

It is preferable to deposit the layer in an essentially inert or reducing atmosphere, for example an $N_2/H_2$ mixture containing no or almost no oxygen, continuously on a ribbon of float glass, in the float chamber and/or in a box for control of the oxygen-free inert atmosphere, in order to deposit it further downstream of the float line, possibly at slightly lower temperatures.

The invention thus allows the manufacture of filtering solar-control glazing assemblies with stacks of the type:
glass/TiN and/or ZrN/thin layer according to the invention/SiOC and/or $SiO_2$, the said layer according to the invention making it possible to have a much stronger interface between, on the one hand, the TiN layer and/or the ZrN layer and, on the other hand, the SiOC layer and/or the $SiO_2$ layer. It also makes it possible to provide effective protection of the TiN and/or ZrN from the risk of surface oxidation either on the industrial line after deposition of the SiOC and/or $SiO_2$ layer, or off the industrial line, for example when the substrate provided with the stack of layers, once it has been cut up, undergoes heat treatments of the bending/toughening or annealing type. Advantageously, the layer has a geometrical thickness of between 10 and 50 nanometers, the thin layer according to the invention has a geometrical thickness of between 5 and 20 nanometers and the SiOC and/or $SiO_2$ overlayer has a geometrical thickness of between 30 and 100 nanometers; or else of the type:

glass/Al/thin layer according to the invention, the aluminum reflective layer either having a small thickness (less than or equal to 30 nm) or having a greater thickness when the mirror function is desired, such as that described in the aforementioned international patent application PCT/FR-96/00362, the entire contents of which are hereby incorporated by reference, the thin layer according to the invention having both a role as oxidation-protection agent and a scratch resistance function.

The invention also makes it possible to produce glazing assemblies whose essential functionality is scratch-resistance, i.e. glazing assemblies such as floor slabs and glass furniture in which the glass substrate is coated only with the thin layer based on $Si_3N_4$ according to the invention, optionally combined with an anti-iridescence layer.

Advantageously the glass is thus protected from any degradation. The thin layer according to the invention may also be combined with low-emissivity layers using stacks of the type:
glass/SiOC/F:$SnO_2$ or ITO/thin layer according to the invention.

In these stacks, the SiOC sublayer may obviously be replaced by other metal oxides, such as those described in patent application EP-0,677,493, the entire contents of which are hereby incorporated by reference.

The thin layer according to the invention likewise makes it possible to manufacture any type of functional glazing assembly provided with a stack of thin layers, which has high durability and is capable of being toughened and/or bent when the substrate used is a glass substrate.

The invention furthermore makes it possible to produce glazing assemblies for which an anti-fouling function is desired, using stacks of the type:
glass/thin layer according to the invention/$TiO_2$ In these stacks, the thin layer according to the invention essentially has the role of acting as a barrier layer to the alkali metals migrating from the glass into the layer based on titanium oxide $TiO_2$, the photocatalytic effect of the latter thus being enhanced. In addition, if the thickness of the layer according to the invention is suitable for it to undergo interferential interaction, it also acts as an anti-iridescence layer.

The titanium oxide $TiO_2$ may be mostly in the form of crystallized particles of the anatase type, as described in patent application WO 97/10188, the entire contents of which are hereby incorporated by reference.

However, it may also be in the form of an at least partially crystallized film, such as that described in patent application WO 97/10186, the entire contents of which are hereby incorporated by reference.

Finally, the invention allows the manufacture of emissive screens of the flat-screen type, such as plasma screens. The thin layer according to the invention may then fulfill different functions depending on the nature of the chemical composition of the substrate on which it is deposited, and/or on the location (front or rear face) of this same substrate in the screen and therefore on the nature of the functional layers which are on top of it, such as the electrodes and the luminophores (photophores), components which are essential for the operation of the screen.

Thus, in the case in which the glass substrate is of the "blocked alkali" type, i.e. having a composition substantially free of diffusing species of the alkaline type, the thin layer according to the invention very effectively fulfills the essential role of barrier layer to the migration of species diffusing from the upper coatings towards the substrate, in particular from the silver-based electrode.

Likewise, in the case in which the composition of the glass substrate contains alkali metals, it also fulfils the role of barrier layer to their migration.

The invention also applies to the surface treatment of glass-bottle type containers or flasks, the hard layer according to the invention strengthening the said containers, for example with respect to handling operations likely to damage them, whatever the observed relative thickness inhomogeneity of the said layer. The deposition of the hard layer according to the invention may thus be carried out on the external wall of the containers, by mechanically strengthening it, in particular protecting it from impact, but also on the internal wall of the containers so as, for example, to prevent components from leaking out of the substrate.

BRIEF DESCRIPTION OF THE DRAWINGS

Other details and advantageous characteristics will emerge below from the description of non-limiting illustrative embodiments with the aid of the appended FIGS. 1 and 2. For the sake of clarity, these figures do not respect the proportions with regard to the relative thicknesses of the various materials.

EXAMPLES

Having generally described this invention, a further understanding can be obtained by reference to certain specific examples which are provided herein for purposes of illustration only and are not intended to be limiting unless otherwise specified.

In all the following examples, the deposition of all thin layers is carried out in the float chamber.

Example 1

Figure 1:
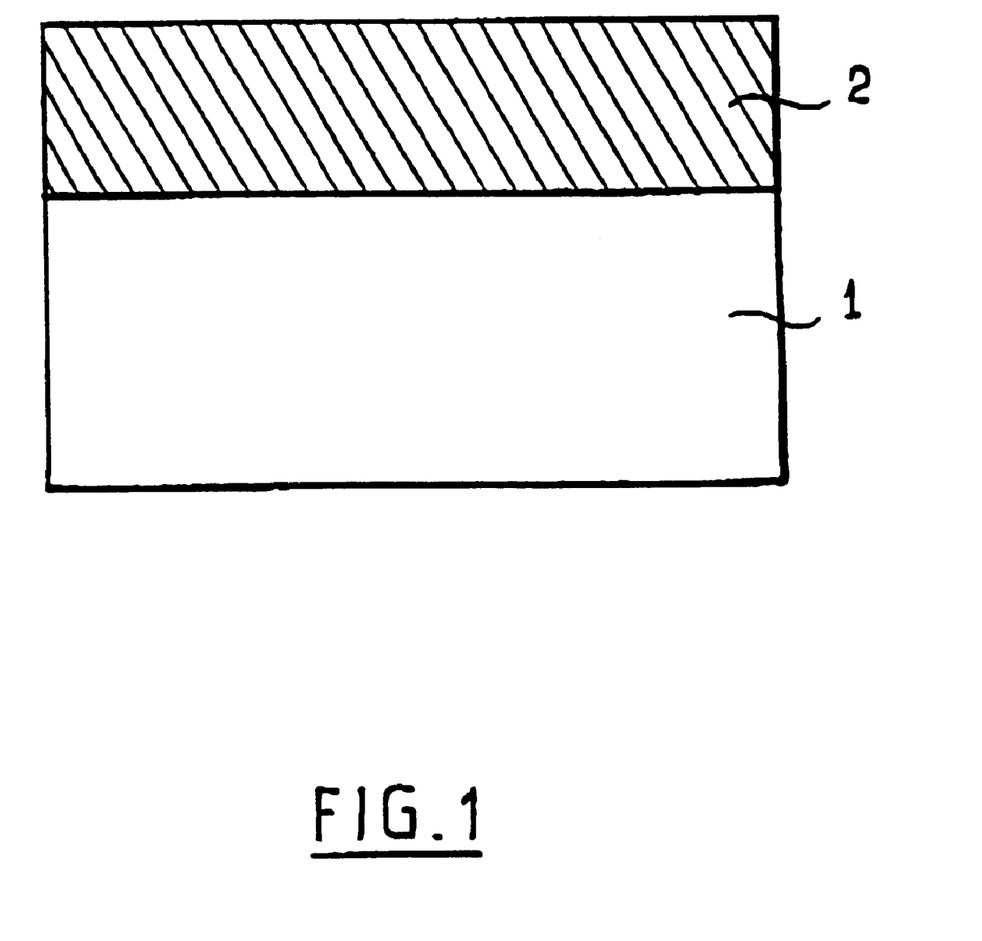
FIG. 1 shows a clear silica-soda-lime glass substrate covered with a thin layer according to the invention.

FIG. 1 shows a clear silica-soda-lime glass substrate 1 having a thickness of 3 millimeters, for example that sold under the trademark PLANILUX by the company Saint-Gobain Vitrage, covered with the thin layer 2 based on silicon nitride developed according to the invention.

The thin layer 2 based on silicon nitride is obtained by means of a gas-phase pyrolysis technique using silane $SiH_4$, which is the silicon-containing precursor, and ethylamine $C_2H_5NH_2$, which is the nitrogen-containing precursor.

The precursor flow rates are chosen such that the volume ratio of the amount of ethylamine to the amount of silane is equal to approximately 10. This parameter is advantageous in that it optimizes the deposition of each of the constituents of the layer. This is because it has been observed that it must not be:

too high, otherwise there may be a risk of nucleation in the gas phase and therefore a risk of forming a powder; or too low, otherwise there may be insufficient incorporation of nitrogen into the layer.

A range of ratios from 5 to 30 proves to be quite satisfactory when it is desired to deposit a layer having a thickness of from 50 to 300 nm using a silane and ethylamine.

The deposition was carried out on the substrate 1 heated to a temperature of between 600 and 650° C., at atmospheric pressure.

Under these conditions, the growth rate of the layer 2 according to the invention reached 60 nm per minute.

The layer 2 obtained as shown in FIG. 1 has a thickness of approximately 350 nanometers and a refractive index of about 1.85.

Microprobe analysis indicates that the layer 2 contains, in atomic percentages, 32.7% of silicon, 30.6% of nitrogen, 21.1% of carbon and 15.6% of oxygen.

The deposition technique according to the invention makes it possible to adjust the amounts of the various components incorporated, in particular that of carbon, by varying various parameters such as the temperature at which the deposition is carried out, the use of an amine other than ethylamine, or of a mixture of amines or of ammonia added to ethylamine as the nitrogen precursor.

The various amines which have suitable reactivity are as follows: methylamine $CH_3NH_2$, dimethylamine $(CH_3)_2NH$, butylamine $C_4H_9NH_2$ and propylamine $C_3H_7NH_2$. Satisfactory temperatures for depositing the layer 2 according to the invention lie within a range of from 550 to 700° C., The spectrophotometric characteristics of such a layer are given in the table below, in which $T_L$, $R_L$ and $A_L$ represent, respectively, the values of the light transmission, the light reflection and the light absorption in percentages:

| | $T_L$ | $R_L$ | $A_L$ |
|---|---|---|---|
| Layer 2 | 84 | 13 | 3 | these values being measured using the $D_{65}$ illuminant, at almost normal incidence.

It is observed that the layer according to the invention has a very low light absorption and that it is free of any haze. (It will be recalled that the haze is the ratio of the diffuse transmission to the light transmission at a wavelength equal to 550 nm).

A test was carried out on the substrate 1 covered with the single layer 2 according to the invention which enabled the mechanical strength of the said layer to be determined. This test is carried out using grinding wheels made from an abrasive powder embedded in an elastomer. The machine is manufactured by the company Taber Instrument Corporation. It is a standard Abrasion Tester model 174 and the grinding wheels are of the CSIOF type and loaded with 500 grams. The covered substrate 1 is subjected locally to 50 rotations and then, using an optical microscope, the number of scratches on four squares of side equal to 1 inch, i.e. 2.54 cm, is counted. After having counted them, the average R of the number of scratches per square is calculated. Finally, the Taber score $T_s$ is calculated from the formula:

$$T_s = -0.18R + 10.$$

For a layer 2 according to the invention, having a geometrical thickness of 300 nanometers, this score is equal to 9.3. This value denotes very little damage and therefore is indicative of very good scratch resistance of the layer according to the invention.

By way of comparative example, it may be noted that a layer of fluorine-doped tin oxide $F:SnO_2$ having a geometrical thickness of 340 nanometers, known as being the "hardest" layer deposited using a gas-phase pyrolysis technique, has, as a result of the test, a Taber score $T_s$ equal to 9.1.

It may therefore be clearly seen that the layer based on silicon nitride according to the invention is a layer which intrinsically has very good resistance to mechanical abrasion and is, from an optical standpoint, very satisfactory since it is highly transparent and has a very low absorbance at wavelengths in the visible range.

Example 2

Figure 2:
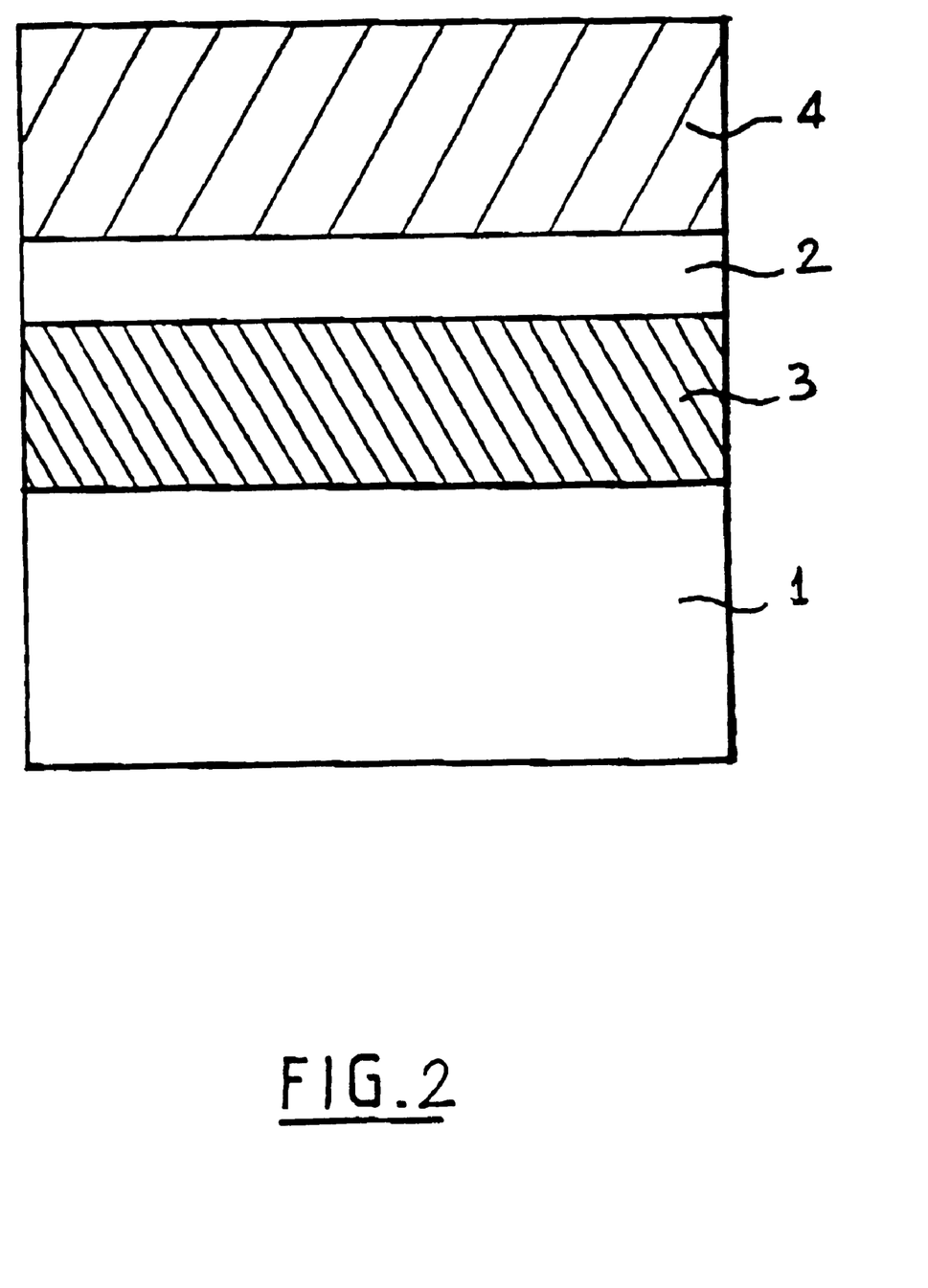
FIG. 2 shows a glazing assembly having a stack of thin layers and a layer according to the invention.

FIG. 2 shows a glazing assembly of the solar protection type, having a stack of thin layers, in which the layer 2 according to the invention has been incorporated.

The clear silica-soda-lime glass substrate 1 having a thickness of 6 millimeters is covered with three successive layers:

a first layer 3 of TiN having a thickness of 23 nm, obtained by gas-phase pyrolysis using titanium tetrachloride $TiCl_4$ and methylamine $CH_3NH_2$, as described in patent application EP-0,638,527, the entire contents of which are hereby incorporated by reference;

a second layer 2 according to the invention having a thickness of approximately 10 nanometers and a refractive index equal to 1.85, deposited under the same conditions as Example 1; and a third layer 4 of silicon oxycarbide SiOC having a thickness of 65 nm and a refractive index equal to 1.65, also obtained by gas-phase pyrolysis using silane and ethylene as described in patent application EP-0,5 18,755, the entire contents of which are hereby incorporated by reference, the layer essentially in silicon-containing form oxidizing on leaving the float, and more particularly in the lehr.

The stack is therefore of the type:
glass/TiN/$Si_3N_4$/SiOC.

Example 3

This comparative example was produced using a stack consisting of:

glass/TiN/SiOC, in which the two layers, of TiN and SiOC, have the same characteristics as those defined above and are obtained under the same deposition conditions.

It is observed that the layer 2 according to the invention, even with a small thickness, creates a very strong interface between the first layer 3 of TiN and the overlayer 4 of SiOC.

In addition, the layer 2 according to the invention provides effective protection of the TiN from any risk of surface oxidation on the industrial line after deposition of the SiOC overlayer 4. Where appropriate, it isolates the TiN when the substrate, once cut up, undergoes subsequent heat treatments of the bending/toughening or annealing type.

Likewise, after having measured the spectro-photometric values, in particular the light transmission $T_L$ for each of the two stacks in Examples 2 and 3, as well as the solar factor $F_s$, it is observed that the selectivity corresponding to the difference $T_L - F_s$ is much better in the case of the three-layer stack of Example 2 with the layer 2 according to the invention sandwiched between the two TiN and SiOC layers, since its value is 10%. In the case of the two layer stack of Example 3, it is less than 7%.

Finally, it should be noted that if, in the two configurations above, the layer based on silicon nitride according to the invention is homogeneous over its thickness, it is also clearly possible to provide a certain compositional inhomogeneity over its thickness, in particular so as to vary the refractive index and allow optimum optical and/or chemical compatibility with the layer on top and/or underneath, such as, for example, a layer enriched in $Si_3N_4$ on the TiN side and a layer enriched in SiON on the SiOC side in a solar protection glazing assembly using the same layers as in Example 2. This "gradient" layer may be obtained by means of the same gas-phase pyrolysis deposition technique, but using a nozzle capable of creating chemical gradients, such as that described in patent application FR-2,736,632, the entire contents of which are hereby incorporated by reference.

In conclusion, the invention has resulted in a novel layer based on silicon nitride, which is particularly able to withstand mechanical abrasion and is highly satisfactory from an optical standpoint since it has a very low absorbance, this not being the case with known $Si_3N_4$-based layers.

Another advantage is that the layer according to the invention may be deposited by gas-phase pyrolysis at high deposition rates using a nitrogen-containing precursor which can be used on an industrial scale without incurring a prohibitive cost burden.

The nitrogen-containing precursor used furthermore has a suitable reactivity since it makes it possible to reach deposition temperatures at which it is possible, without any major difficulty, to produce three-layer stacks in line on the ribbon of float glass. Thus, it is possible to produce an anti-solar glazing assembly with a TiN functional layer and an SiOC layer, wherein the layer according to the invention may be advantageously incorporated in the conventional two-stack layer in order to give a stronger interface and to isolate the functional layer from oxidation deposition of the SiOC overlayer, without disrupting production on the industrial line, or else during heat treatments on the substrate off the industrial line.

Having now fully described the invention, it will be apparent to one of ordinary skill in the art that many changes and modifications can be made thereto without departing from the spirit or scope of the invention as set forth herein.

This application is based on a French Patent Application No. 97 01468, filed Feb. 10, 1997, the entire contents of which are hereby incorporated by reference.

What is claimed as new and desired to be secured by Letters Patent of the United States is:

1. A process for depositing a layer on a transparent glass substrate, comprising:

in an essentially inert atmosphere or hydrogen-containing atmosphere that does not contain oxygen and which contains at least one silicon precursor and at least one nitrogen precursor that is an amine at a molar ratio of nitrogen precursor to silicon precursor ranging from 5 to 30, conducting gas-phase pyrolysis at a temperature ranging from 550–760° C., thereby depositing a silicon/nitrogen containing coating onto a ribbon of float glass.

2. The process according to claim 1, wherein said silicon precursor is selected from the group consisting of silicon hydride, alkyl silane, silazane and a mixture thereof.

3. The process according to claim 1, wherein said amine is a primary, secondary or tertiary amine.

4. The process according to claim 3, wherein said amine is ethylamine $C_2H_5NH_2$, methylamine $CH_3NH_2$, dimethylamine $(CH_3)_2NH$, butylamine $C_4H_9NH_2$ or propylamine $C_3H_7NH_2$.

5. The process according to claim 1, in the gas-phase pyrolysis, adding a precursor selected from the group consisting of $CF_4$, organic phosphate, $PO(OCH_3)_3$, triethylphosphate, trimethylphosphate, trimethylborite, $PCl_3$, $PF_3$, $PBr_3$, $PCl_5$ and a mixture thereof to said at least two precursors which are pyrolyzed.

* * * * *

UNITED STATES PATENT AND TRADEMARK OFFICE
CERTIFICATE OF CORRECTION

PATENT NO. : 6,503,557 B1  Page 1 of 1
DATED : January 7, 2003
INVENTOR(S) : Laurent Joret It is certified that error appears in the above-identified patent and that said Letters Patent is hereby corrected as shown below:

<u>Column 3,</u>
Line 25, "fulfil" should read -- fulfill --.

<u>Column 5,</u>
Lines 53 and 59, "fulfil" should read -- fulfill --.

<u>Column 9,</u>
Line 27, "fulfil" should read -- fulfill --.

Signed and Sealed this

First Day of July, 2003

JAMES E. ROGAN
*Director of the United States Patent and Trademark Office*